United States Patent [19]
Bisaro et al.

[11] Patent Number: 5,141,894
[45] Date of Patent: Aug. 25, 1992

[54] METHOD FOR THE MANUFACTURE, BY EPITAXY, OF MONOCRYSTALLINE LAYERS OF MATERIALS WITH DIFFERENT LATTICE PARAMETERS

[75] Inventors: René Bisaro, Saint Maur des Fosses; Alain Friederich, Paris, both of France

[73] Assignee: Thomson-CSF, Puteaux, France

[21] Appl. No.: 554,884

[22] Filed: Jul. 20, 1990

[30] Foreign Application Priority Data

Aug. 1, 1989 [FR] France ............................... 89 10363

[51] Int. Cl.⁵ ............................................ H01L 21/20
[52] U.S. Cl. ................................... 437/132; 156/610; 437/24; 437/81; 437/82; 437/108; 437/133; 437/173; 437/247; 437/931; 437/934
[58] Field of Search ................... 148/DIG. 3, 22, 72, 148/65, 143, 154, 150, 149; 156/610–614; 428/248.1, 255.1; 437/22, 24–26, 81, 82, 83, 84, 108, 111, 132, 133, 247, 173, 931, 934, 949, 962, 973

[56] References Cited

U.S. PATENT DOCUMENTS

| | | | |
|---|---|---|---|
| 4,312,681 | 1/1982 | Rupprecht et al. | 437/22 |
| 4,391,651 | 7/1983 | Yoder | 437/22 |
| 4,509,990 | 4/1985 | Vasudev | 437/26 |
| 4,561,916 | 12/1985 | Akiyama et al. | 156/612 |
| 4,576,652 | 3/1986 | Hovel et al. | 437/22 |
| 4,713,354 | 12/1987 | Egawa et al. | 437/22 |
| 4,757,030 | 7/1988 | Galvin et al. | 437/132 |
| 4,818,721 | 4/1989 | Wang | 437/22 |
| 4,835,116 | 5/1989 | Lee et al. | 437/111 |
| 4,863,877 | 9/1989 | Fan et al. | 437/22 |

OTHER PUBLICATIONS

Extended Abstracts, vol. 86-1, No. 1, May 1986, pp. 115-116, Pennington, N.J., U.S.; M. T. Duffy et al.: "Characterization of solid-phase regrown silicon films on sapphire".

IEEE International Electron Devices Meeting 1985, Washington, DC, Dec. 1-4, 1985, pp. 676-679; D. C. Mayer et al.: "A high-speed submicrometer CMOS/SOS process in SPEAR material".

IEE Proceedings Section A a I, vol. 133, No. 3, part 1, Jun. 1986, pp. 66-76, Hitchins, Herts, GB; S. L. Partridge: "Silicon-on-insulator technology".

Extended Abstracts of the 19th Conference on Solid State Devices and Materials, Tokyo, JP, Aug. 25-27, 1987, pp. 143-146; S. Naritsuka et al.: "Growth of GaAs layers on (001) Si substrates".

Applied Physics Letters, vol. 51, No. 22, Nov. 30, 1987, pp. 1801-1803, New York, N.Y., U.S.; J. Varrio et al.: "New approach to growth of high-quality GaAs layers on Si substrates".

Primary Examiner—Robert Kunemund
Attorney, Agent, or Firm—Oblon, Spivak, McClelland, Maier & Neustadt

[57] ABSTRACT

A method for the manufacturing, by epitaxy, of monocrystalline layers of materials with different lattice parameters that includes:
- a first step for the epitaxial deposition, on a first layer made of a material having a determined lattice parameter, of a second layer with a determined thickness made of a material having a lattice parameter different from that of the first layer,
- a second step of ion implanation designed to create a zone, in the second layer, limiting the spread of the dislocations, and at least,
- one third step for the epitaxial deposition, on the second layer, of a third layer made of the same material as the second layer. The disclosed method can be applied to the manufacture of opto-electronic or microwave devices made of GaAs on Si substrates.

19 Claims, 2 Drawing Sheets

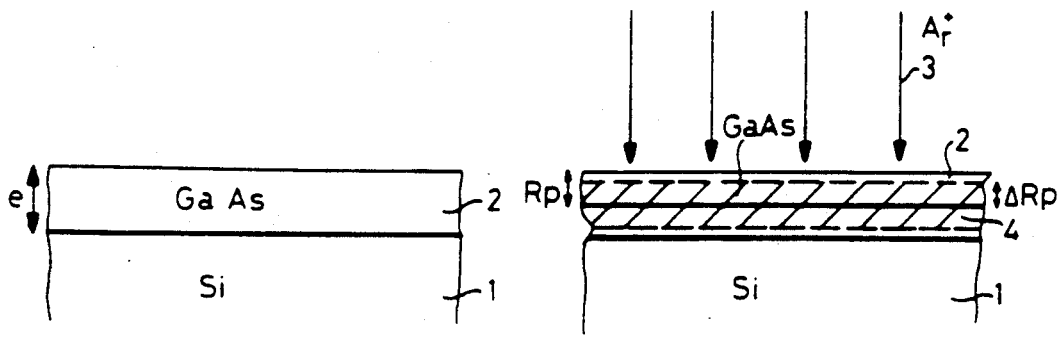
FIG_1a   FIG_1b
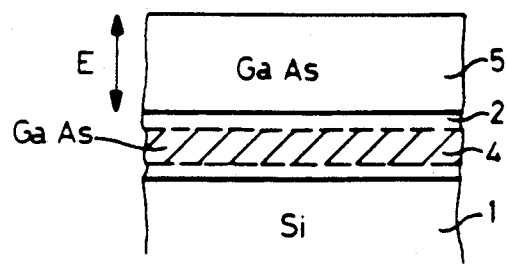
FIG_1c
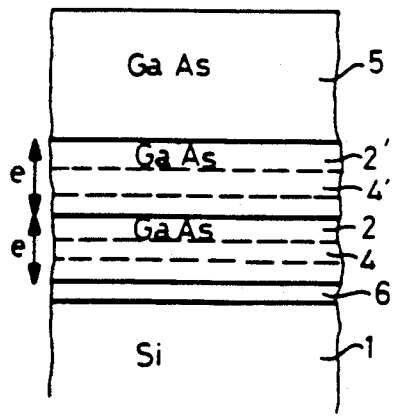
FIG_2
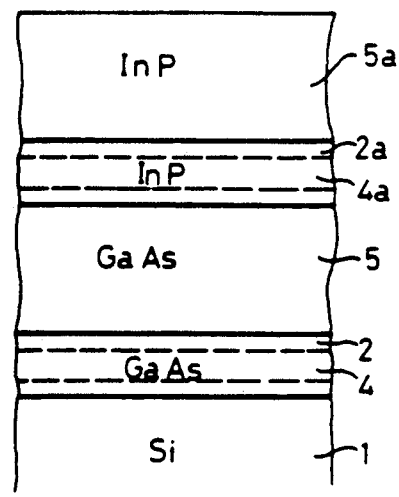
FIG_3

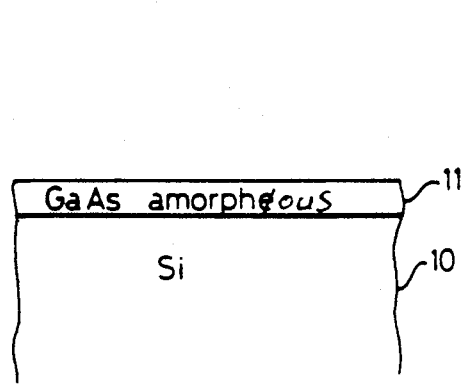
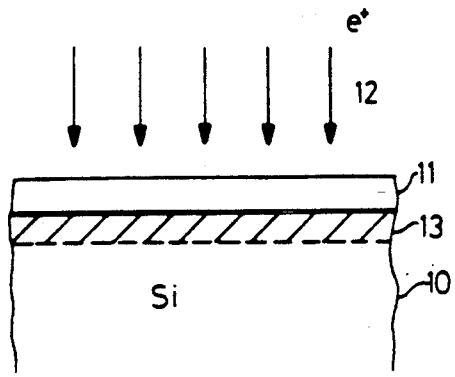
FIG_4a    FIG_4b
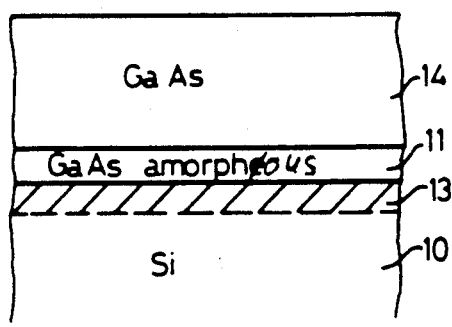
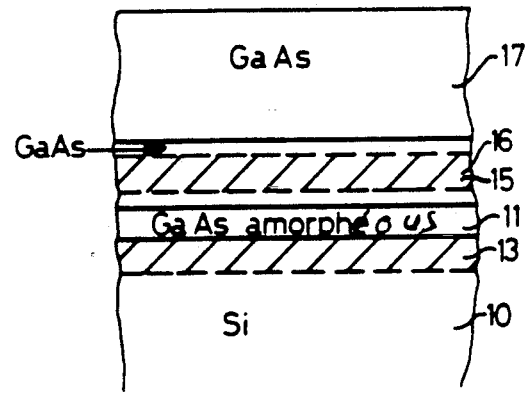
FIG_4c    FIG_4d
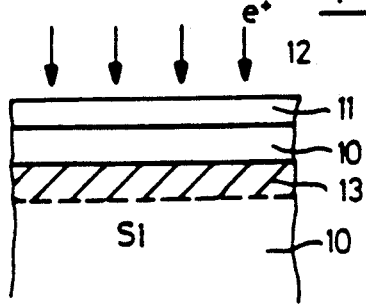
FIG_4b'

METHOD FOR THE MANUFACTURE, BY EPITAXY, OF MONOCRYSTALLINE LAYERS OF MATERIALS WITH DIFFERENT LATTICE PARAMETERS

BACKGROUND OF THE INVENTION

1. Field of the Invention

The present invention concerns a method for manufacturing monocrystalline layers of materials with different lattice parameters.

In general, to make semiconductor devices, at least one monocrystalline layer is grown epitaxially on a substrate. Now this epitaxial growth of a material on a substrate is very difficult when the mismatching of the lattice parameters is very great. However, for reasons of cost and specific technical characteristics, it is ever increasingly being sought to make substrates of silicon or other materials of the same type in the manufacture of opto-electronic devices such as lasers, photodiodes, photocathodes or similar devices and microwave devices such as GUNN diodes, and IMPATT diodes, FETs which are made with III/V compounds of the periodic table of elements, or infrared detectors made with multiple quantum well structures of III-V materials, or by means of II/VI or IV/VI compounds of the periodic table of elements. Thus, the mismatching of the lattice parameters, given by the ratio $\delta a/a$, is 4.1% between gallium arsenide and silicon, and 8.1% between indium phosphide and silicon. As a consequence, dislocations are created during growth. In effect, since the energy per unit of interface between the two materials increases proportionally with the thickness of the layer, for a given critical thickness it becomes more advantageous, in terms of energy, to create a dislocation than to continue the epitaxy under anisotropic biaxial compressive stress. Now, a number of dislocations cross the layer. This is a very great hindrance to the efficient working of the devices made on these epitaxiated layers. Thus, in the case of an epitaxy of GaAs on silicon, $10^{12}$ dislocations per $cm^2$ at least are not localized in the vicinity of the interface.

2. Description of the Prior Art

At present, there are different methods aimed at reducing the number of dislocations in the upper part of the layer. Among these methods, we might cite the use of thermal annealing cycles, done off site. This thermal annealing modifies the direction of the dislocation lines without modifying their number. Another method uses in situ annealing cycles which considerably improve the rate of dislocations if they are made after about 1000 Å of growth at low temperature without, however, reducing them beyond the critical value. Other methods include the use of superlattices between the substrate and the monocrystalline layer, the use of quantum well structures, the efficiency of which is limited when the rate of dislocations is very high or the use of cycles of growth which may or may not be coupled with annealing cycles. However, none of these methods has made it possible to reduce the rate of dislocations to below a value of $10^6$ per $cm^2$.

SUMMARY OF THE INVENTION

The present invention is therefore aimed at proposing a new method for the manufacture, by epitaxy, of monocrystalline layers of materials with very different lattice parameters, that enables considerable reduction in the number of dislocations spreading in the layer being formed.

Thus, an object of the present invention is a method for the manufacture of monocrystalline layers of materials with different lattice parameters, in which an epitaxial deposition is made, on a first layer of a material having a determined lattice parameter, of at least one additional monocrystalline layer made of a material having a lattice parameter different from that of the adjacent layer, wherein there is created, by ion implantation in the second layer or at the junction between two layers, at least one zone limiting the spread of the dislocations.

Thus, by ion or proton implantation, there are created either anchoring points for the dislocations preventing their spread towards the surface or zones of stresses enabling the curvature of the dislocations, or an amorphous zone that mechanically disconnects the substrate from the epitaxiated layer, making the in fine wafer less stressed and less curved.

A first specific manufacturing method according to the present invention comprises the following steps:
- a first step for the epitaxial deposition, on a first layer made of a material having a determined lattice parameter, of a second layer with a determined thickness made of a material having a lattice parameter different from that of the first layer;
- a second step of ion implantation designed to create a zone, in the second layer, limiting the spread of the dislocations, and at least
- one third step for the epitaxial deposition, on the second layer, of a third layer made of the same material as the second layer.

Preferably, before the first step of epitaxial deposition, the first layer or substrate is covered with a monomolecular matching preliminary layer. This preliminary layer enables the surface of the substrate to be smoothened and may also set up electrical insulation between the substrate and the monocrystalline layer if it is thicker. It may be of the same nature as the substrate or of a different nature.

Another method according to the present invention comprises the following steps:
- a first step for the deposition, on a first layer or substrate made of a material with a determined lattice parameter, of a monomolecular matching preliminary layer,
- a second step of ion implantation designed to create, on the surface, a disturbed zone limiting the dislocations in the second layer (step 4),
- a third cleaning step, and
- a fourth step for the epitaxial deposition of a second layer made of a material having a lattice parameter that is different from that of the first layer.

If necessary, the above method further comprises:
- a fifth step of ion implantation designed to create a zone, in the second layer, limiting the spread of the dislocations, and
- a sixth step for the epitaxial deposition, on the second layer, of a third layer made of the same material as the second layer.

BRIEF DESCRIPTION OF THE DRAWINGS

Other characteristics and advantages of the present invention will appear from the following description of various variants of the manufacturing method according to the invention, made with reference to the appended drawings, wherein:

FIGS. 1a to 1c give a schematic view of a device made by the main steps of the method according to the present invention.

FIG. 2 shows another variant of the manufacturing method of the present invention;

FIG. 3 gives a schematic view of yet another variant of the manufacturing method of the present invention, and FIGS. 4a to 4d give a schematic view of the different steps for making a device according to one variant of the method of the present invention.

To simplify the description, the same elements bear the same references in the figures. Moreover, with a view to clarity, the thicknesses of the different layers made by the method according to the present invention have not been maintained in the figures.

DETAILED DESCRIPTION OF THE INVENTION

As shown in FIG. 1a, according to the present invention, on a first layer or substrate 1 which may be made, for example, of silicon, indium phosphide (InP), gallium arsenide (GaAs), germanium or any other material having a determined lattice parameter, a second layer 2 with a controlled thickness e is grown by epitaxy. This second layer 2 is made of a material with a lattice parameter different from that of the substrate. In the manufacturing method shown, a layer 2 of gallium arsenide (GaAs) has been grown on silicon (Si). The growth of gallium arsenide has been done to a thickness e of 3000 Å. In fact, as explained here below, the thickness of the layer 2 depends on the energy and the type of ions used during the following step of ion implantation. Then, as the case may be, on site or in another device, an ion implantation 3 is done. In the manufacturing method shown, argon ions have been used. Other types of ions may be used. These ions may be dopant impurities or non-dopant impurities such as, for example: manganese, aluminium, silicon, chromium, iron, nickel, cobalt, copper, germanium, tin, selenium, tellurium, erbium, vanadium, beryllium, zinc, cadmium, boron, chlorine, arsenic, gallium, indium, phosphorous, lithium, gold, tungsten, carbon, titanium, silver, nitrogen, oxygen, sulphur, hydrogen, fluorine, bromium, or even protons, or any types of ions capable of being implanted or of creating faults in the first epitaxiated layer 2. As shown in FIG. 2b, this implantation of ions creates anchoring points for the dislocations in a layer which is centered at a depth $R_P$ (R being a value that is a function of the ion and of the energy) and having a width of $2.35 \times R_P$ (representing the width at the mid-maximum point of the Gaussian distribution of the ions implanted in the material) so as to form the disturbed zone 4. The thickness of the GaAs layer is chosen so as to have a layer, above the disturbed zone 4, with crystallinity sufficient to enable a resumption of epitaxy. For example, the thickness e is 3000 Å in the case of $Ar^+$ ions implanted under energy with a value of 300 KeV.

As the case may be, before the ion implantation, the sample can be subjected to a thermal annealing cycle which may or may not be carried out in the epitaxy apparatus. This thermal annealing cycle enables a pre-curvature of the dislocations to be obtained.

Then, after the ion implantation, the epitaxy is resumed to a thickness E, using the same material as that of the second layer, namely GaAs in the manufacturing method described. This resumption of epitaxy is done at the lowest possible temperature, to prevent the healing of the intentionally created faults. The sample shown in FIG. 1c is obtained. This sample includes a terminal layer 5 with a thickness E generally between 2.5μ and 3.5μ.

As shown in FIGS. 2 and 3, there may be different variants to the above-described method. In particular, before the first epitaxy is done, the substrate 1 may be covered with a monomolecular or thicker matching preliminary layer 6. This preliminary layer may be made of arsenic or gallium or AlAs or $CaF_2$, $Ca_xSr_{(1-x)}F_2$, $Al_xGa_{(1-x)}As$, $Ga_xIn_{(1-x)}P$, $Ga_xIn_{(1-x)}As$, $In_xGa_{(1-x)}As_{(1-y)}P_y$ or any other material commonly used for this type of preliminary layer. Furthermore, as shown in FIG. 2, several superimposed, disturbed zones 4, 4' may be formed. In this case, after the ion implantation has been done in the second layer 2, made of GaAs for example, the epitaxy of a layer 2' is resumed to a thickness e in using the same material and the same epitaxial technique as those used for the layer 2, and an ion implantation is repeated in this layer 2' so as to create the zone 4'. This operation may be repeated several times. Then, on the last layer thus created, the making of the structure is completed by a standard epitaxy giving the layer 5. In general, to prevent the healing of the faults created by the ion implantation, the epitaxy of the layer 5 will be done at the lowest possible temperature. In the same way, all the subsequent operations of thermal treatment used to improve the crystalline quality of the epitaxiated layers 5, 2, 2' will be done by techniques such as the flash annealing technique that makes it possible to obtain an annealed surface in order to prevent the healing of the faults intentionally introduced by ion implantation.

According to one variant shown in FIG. 3, the method of the present invention can be used to epitaxiate successive layers made of materials having very different lattice parameters. Thus, in FIG. 3, a structure with three layers, for example an Si GaAs InP structure, has been made. In this case, a GaAs layer 2 has been epitaxially grown on the silicon substrate 1. In this layer 2, a disturbed zone 4 has been created by ion implantation, and then a final GaAs layer 5 has been epitaxially grown. Then, on the layer 5, an InP layer 2a has been epitaxially grown, and a disturbed zone 4a has been created in this layer 2a by ion implantation, and on this layer 2a, a final InP layer 5a has been epitaxially grown.

Referring to FIGS. 4a to 4d, we shall now described a variant of the method of the first invention. As shown in FIG. 4a, on a first layer or substrate 10, made of a material with a determined lattice parameter, such as silicon for example, a monomolecular preliminary layer 11 has been deposited. This preliminary layer 11 is used to stabilize the silicon surface in a standard way. In this variant, the preliminary layer 11 is also used to protect the silicon, if the sample has to brought out of the epitaxy stand during the subsequent implantation stage. This preliminary layer may be made of arsenic, gallium or even, in this case, gallium arsenide which may be amorphous as the case may be. It may be thicker and may have other functions, such as electrical insulation. It will then be made of Si, $CaF_2$. This list of materials is not exhaustive. Materials such as AlAs, $Ga_{1-x}Al_xAs$ etc. may be considered.

As shown in FIG. 4b, the substrate 10, namely the silicon, has been implanted through this preliminary layer so as to create a highly disturbed, or even amorphous, monocrystalline zone 13 on the surface of the silicon (FIG. 4b) or within it (FIG. 4b'). The zone above this zone 13 will be disturbed and will accomodate the difference in lattice parameters with fewer dislocations than in the epitaxiated layer. The implantation is done with e⁻ ions 12 of the same type as those mentioned above. Then, the sample is subjected to a cleaning which may be done off site or on site. Then, once the cleaning is done, the epitaxy of the layer is resumed with a material having a different lattice parameter, such as GaAs, so as to complete the sample. A sample is obtained with a final layer 14 made of GaAs as shown in FIG. 4c.

As shown in FIG. 4d, according to one variant of this method, it is possible to create disturbed zones above the preliminary layer 11. Thus, on the layer 11, a layer 16 is grown epitaxially. This layer 16 is made of the material having the lattice parameter different from that of the substrate 10, and it is grown on a determined length. Then, by ion implantation, a disturbed zone 15 is created in this layer 16. Then, as described above for the first manufacturing method, a final layer 17 is epitaxially grown in the material having said determined lattice parameter, namely GaAs in the manufacturing method shown.

According to one variant that can be used in both methods, the ion implantation is achieved by successive implantations of different ions so as to create disturbed zones parallel to one another in the same epitaxiated layer 2 or 16.

According to another variant giving a substantially identical result, the ion implantation is achieved by successive implantations of one and the same ion at different energy levels. For, as mentioned above, the distance $R_P$ and the value $\Delta R_P$ depend on the type of ions or protons used for the ion implantation as well as on the energy applied, and on the charge of the ion.

Furthermore, the epitaxy can be done by using any known method of epitaxy and, notably, vapor phase epitaxy, metal organic chemical vapor deposition (MOCVD), molecular beam epitaxy (MBE), metal organic molecular beam epitaxy (MOMBE) or liquid phase epitaxy. In this case, certain parameters will be modified, notably the temperature of the annealing cycles and the epitaxy temperature as is well known to those skilled in the art.

We shall now describe a practical example of the application of the method according to the present invention.

In this practical example, the epitaxial method used is that of molecular beam epitaxy. The sample has been made from a silicon substrate. First of all the surface of the silicon is cleaned, off site and then on site, at high temperature (namely between 900° and 1000° C.) to remove the volatile oxides created by the off-site cleaning procedure. Then a monomolecular preliminary layer of arsenic is deposited in a known way. As the case may be, the preliminary layer may be made of gallium. Then, on this preliminary layer, a layer of GaAs is grown to a thickness of 100 A at low temperature, namely at a temperature of about 300° C. This growth is achieved by means of an alternated flux technique known to those skilled in the art as migration enhanced epitaxy (MEE). Then, the growth is continued to a thickness of about 300 A, using the standard conditions of the continuous and simultaneous flux of Ga and As with a speed of 0.5 μm/h at the same temperature, namely a temperature of 300° C. to 350° C.

Then a thermal annealing cycle is carried out on site at a temperature of 620° C. The dislocations are formed at the interface. The epitaxial growth is continued under coupled flux at 575° C. until the epitaxial layer has a thickness of 3000 Å. The sample is then subjected to an ion implantation of argon ions under 300 KeV of energy with $10^{15}$ ions per cm². This implantation creates anchoring points for the dislocations which, in this case, are at a depth $R_P$ equal to 2052 Å and on a width $2.35 \times \Delta R_P$ equal to $2.35 \times 711$ A. In fact, the energy of the ions should be such that a surface zone of variable thickness, namely a thickness in the range of some hundreds of Angstroms for the above-mentioned energy levels, should have a crystalline quality sufficient to enable a resumption of epitaxy. This implantation of ions has therefore enabled the creation of a zone with a crystalline periodicity that is highly disorganized (or even rendered amorphous). Once the disturbed zone is created, the epitaxy is resumed at 580° C. until a perfectly crystalline surface is obtained, and then at 575° C. using the technique of continuous and simultaneous fluxes of GaAs. This epitaxy is done until the GaAs layer has a thickness of between 2.5 microns and 3.5 microns.

It is clear to those skilled in the art that the matching of the lattices can be further improved by using the standard techniques already known, notably by inserting superlattices and/or quantum wells in the above-described sample structure. The annealing at 620° C. of the layer grown by MEE may be unnecessary.

The above description has been given purely as a non-restrictive example. Other variants may be envisaged by those skilled in the art without going beyond the scope of the invention. In particular, the numerical examples and the examples of materials used have been given only to illustrate the invention. In effect, the layers of materials having different lattice parameters may be made of semiconductor materials such as silicon, germanium or the III-V, II-VI and IV-VI groups of compounds of the periodic table of elements. If necessary, one of the layers may be made of an insulator material chosen from among $SrF_2$, $BaF_2$, $CaF_2$, $Ca_xSr_{1-x}F_2$, zirconia, zirconia-yytrium, (YSZ), MgO, BeO, $Al_2O_3$, corundum, sapphire, $SrTiO_3$, $BaTiO_3$, diamond, quartz, $SiO_2$.

What is claimed is:

1. A method for the manufacture of monocrystalline layers of materials with different lattice parameters, comprising the steps of:

epitaxially depositing on a first layer of a material having a determined lattice parameter, at least one additional monocrystalline layer made of a material having a lattice parameter different from that of the adjacent layer;

creating by ion implantation in the second layer or at the junction between two layers, at least one zone limiting the spread of the dislocations;

epitaxially depositing third layer upon said second layer; and wherein said at least one zone limiting the spread of dislocations is present during the epitaxial deposition of said third layer upon said second layer.

2. A method according to claim 1, wherein:

said epitaxially depositing on a first layer is a first step, said creating by ion implantation is a second step and said epitaxially depositing a third layer is a third step;

the second layer has a determined thickness and is made of a material having a lattice parameter which is different from that of the first layer;

the third layer is made of the same material as the second layer.

3. A method according to claim 2, wherein:
before the first step of epitaxial deposition, covering the first layer or substrate with a matching preliminary layer that is at least one monomolecular layer thick.

4. A method according to claim 2 or claim 3, wherein:
the second step of ion implantation is preceeded by a cycle of surface or standard thermal annealing.

5. A method according to claim 2, wherein:
the first and second steps are repeated several times before the third step is implemented.

6. A method according to claim 2, wherein:
the first and third steps are repeated several times with layers having different lattice parameters.

7. A method according to claim 2, wherein:
the thickness of the second layer is a function of the value $\Delta R_P$ characteristic of the ion and of the implantation energy used.

8. A method according to claim 1, further comprising the following steps:
a first step of depositing on a first layer made of a material with a determined lattice parameter, of a matching preliminary layer that is at least one monomolecular layer thick,
a second step of ion implanting, thereby creating on the surface of or within the first layer, a disturbed zone limiting the spread of dislocations,
a third cleaning step, and
a fourth step of epitaxially depositing a second layer made of a material having a lattice parameter that is different from that of the first layer.

9. A method according to claim 8, further comprising:
a first step of ion implanting, thereby creating a zone in the second layer limiting the spread of dislocations; and
a sixth step of epitaxially depositing on the second layer, a third layer made of the same material as the second layer.

10. A method according to one of claims 2, 8 or 9, wherein: the ion implantation is done by means of protons or ions such as: manganese, aluminium, silicon, chromium, iron, nickel, cobalt, copper, germanium, tin, selenium, tellurium, erbium, vanadium, beryllium, zinc, cadmium, boron, chlorine, arsenic, gallium, indium, phosphorus, lithium, gold, tungsten, carbon, titanium, silver, nitrogen, oxygen, sulphur, hydrogen, fluorine, bromium, argon, krypton, neon and/or all types of ions capable of being implanted and capable of creating faults in the first epitaxiated layer.

11. A method according to claim 10, wherein: the ion implantation is constituted by successive implantations of different ions.

12. A method according to claim 10, wherein: the ion implantation is constituted by successive implantations of the same type of ion at different levels of energy.

13. A method according to claim 1, wherein: the layers made of material having different lattice parameters are made of semiconductor materials, and one of them may be an insulator.

14. A method according to claim 1, wherein: one of the layers made of material having difference lattice parameters is made of an insulating material.

15. A method according to claim 13, wherein: the semiconductor material is chosen from among silicon, germanium and the III–V, II–VI and IV–VI groups of compounds of the periodic table of elements.

16. A method according to claim 14, wherein: the insulator material is chosen from among $SrF_2$, $BaF_2$, $CaF_2$, $Ca_xSr_{1-x}F_2$, zirconia, zirconia-yttrium, (YSZ), MgO, BeO, $Al_2O_3$, corundum, sapphire, $SrTiO_3$, $BaTiO_3$, diamond, quartz, and $SiO_2$.

17. A method according to claim 1, wherein: the epitaxial deposition is done by at least one of vapor phase epitaxy, metal organic chemical vapor deposition (MOCVD), molecular beam epitaxy (MBE), metal organic molecular beam epitaxy (MOMBE), or liquid phase epitaxy.

18. A method according to one of the claims 2, 6, 7, or 8, wherein: the epitaxial deposition of the last layer is done at low temperature.

19. A method according to claim 1, wherein: the upper layer is subjected to a flash annealing process.

* * * * *